United States Patent [19]
Estakhri et al.

[11] Patent Number: 5,818,350
[45] Date of Patent: *Oct. 6, 1998

[54] HIGH PERFORMANCE METHOD OF AND SYSTEM FOR SELECTING ONE OF A PLURALITY OF IC CHIP WHILE REQUIRING MINIMAL SELECT LINES

[75] Inventors: Petro Estakhri, Pleasanton; Mahmud Assar, Morgan Hill, both of Calif.

[73] Assignee: Lexar Microsystems Inc., Fremont, Calif.

[*] Notice: The terminal 10 months of this patent has been disclaimed.

[21] Appl. No.: 420,239

[22] Filed: Apr. 11, 1995

[51] Int. Cl.⁶ ................................................ H04Q 1/00
[52] U.S. Cl. ...................... 340/825.52; 395/405
[58] Field of Search .................... 340/825.52, 825.05, 340/825.06; 365/230.03, 230.06, 230.08, 239, 240; 395/405

[56] References Cited

U.S. PATENT DOCUMENTS

| 4,006,457 | 2/1977 | Hepworth et al. | 365/230.06 |
| 4,710,871 | 12/1987 | Belknap et al. | 340/825.05 X |
| 4,727,475 | 2/1988 | Kiremidjian | 340/825.52 X |
| 4,740,882 | 4/1988 | Miller | 340/825.06 X |
| 5,430,859 | 7/1995 | Norman et al. | 395/425 |

Primary Examiner—Edwin C. Holloway, III
Attorney, Agent, or Firm—Maryam Imam

[57] ABSTRACT

A circuit is provided for selecting one of plurality of integrated circuit chips with a minimum number of chip select signal lines. A first embodiment includes a plurality of paired address lines; each line in each pair provides a logical complementary signal. Only a selected one of the lines of each pair is coupled to integrated circuit. Each of the integrated circuits is coupled to a unique combination of these selected lines of the pairs. In a second embodiment a select signal is clocked by a controller from one of the integrated circuits to the next in a fashion similar to a shift register. Once the select signal is present in the desired integrated circuit, the controller then provides an enable signal to all the integrated circuits which enables only that desired integrated circuit. In yet another embodiment, the address lines are also used a chip select signal lines, one address line for each integrated circuit. A Chip_select_ clock_enable line is used to toggle the chip select signal to the desired device. In a preferred embodiment, a unique value is stored in a register on each integrated circuit. A controller places the unique value of a desired integrated circuit onto a bus. A comparator in each integrated circuit determines which chip has been selected. The controller then provides a chip select signal to activate the desired integrated circuit.

12 Claims, 6 Drawing Sheets

HIGH PERFORMANCE METHOD OF AND SYSTEM FOR SELECTING ONE OF A PLURALITY OF IC CHIP WHILE REQUIRING MINIMAL SELECT LINES

FIELD OF THE INVENTION

This invention relates to the field of circuits for selecting one of a plurality of integrated circuit devices. More particularly, this invention relates to a chip select method and apparatus that reduces the number of chip select lines while minimizing the impact on system performance.

BACKGROUND OF THE INVENTION

It is well known that many integrated circuits are designed to include a chip select input. Chip select signals are used to conveniently control which integrated circuit is capable of controlling a signal bus. A common example of the use of chip select signals is for a memory card for use in a computer system FIG. 1 shows such a system. The system includes n commercially available memory chips, such as 256K DRAMs 10, 12 through 16. Each of these memory chips 10–16 are bi-directionally coupled to a data bus 18. Data can be written to one of the memory chips 10–16 from the data bus 18, or read from one of the memory chips onto the data bus. It should be apparent to persons of ordinary skill in the art that these techniques are equally applicable to all types of memory chips including SRAMs, VRAMs, ROMs, PROMs, EPROMs, EEPROMs, and Flash Memory. If more than one of the memory chips is able to communicate with the data bus at a time, it would not be possible to control what data is read onto the bus. These techniques can also be applied to chip select signals for logic circuits in addition to memory circuits.

To overcome such problems,. prior designers of memory chips and memory board utilized chip select signal lines 20, 22 through 26. Consider the memory chip 12 for example. The input/output circuit of the memory chip 12 is disabled except during the time that its chip select signal 22 is activated. For the design of a memory board, each memory chip 10–16 includes a chip select signal line 22–26. Only one of the chip select signal lines 20–26 is activated at a time. This prevents more than one of the memory chips 10–16 from providing data to or receiving data from the memory bus 18.

In one class of prior art memory board designs, at least a portion of an address would be provided by a controller integrated circuit 28 to a decoding circuit 30. Based upon the address, the decoder 30 activates one and only one of the chip select signal lines 20–26. One common circuit for achieving this result includes a plurality of multiple input AND gates 40, 42 and 46 which are used as decoders. Each one of the AND gates is configured to receive and decode a selected combination of the address lines from the controller 28. Unfortunately, with a system such as shown in FIG. 1, in addition to the decoder 30 considerable area on a printed circuit board is consumed by the chip select signal lines 22–26.

FIG. 2 shows a block diagram of an alternate prior art system from that of FIG. 1. Those elements that are common in any of the various figures are labeled with identical reference numerals. According to the class of designs shown in FIG. 2, the controller circuit 28 and the decoder 30 are combined into a single controller/decoder integrated circuit 32. The controller/multiplexer integrated circuit 32 includes a plurality of multiple input AND gates 50, 52, 54 and 56. Each one of the AND gates is configured to receive a combination of the address lines from other circuitry within the controller/decoder 32. The design of FIG. 2 demonstrates a possible improvement over the design of FIG. 1 if the controller has sufficient pins to provide all the necessary chip select lines. However, an integrated circuit built according to FIG. 2 requires additional pins. Generally, integrated circuits are pin limited. Further, even a system built according to the design of FIG. 2 suffers from the loss of area on the printed circuit board due to the multiple chip select lines 20–26.

As can readily be seen from the drawings of FIGS. 1 and 2, the memory devices are coupled from the controller by an address bus and also by an appropriate chip select line. In the example, there are 32 memory devices so that there are 32 chip select lines. If the memory devices contain 256K addressable locations, then the address bus contains 18 address lines.

SUMMARY OF THE INVENTION

A circuit is provided for selecting one of plurality of integrated circuit chips with a minimum number of chip select signal lines. A first embodiment includes a plurality of paired address lines; each line in each pair provides a logical complementary signal. Only a selected one of the lines of each pair is coupled to integrated circuit. Each of the integrated circuits is coupled to a unique combination of these selected lines of the pairs. In a second embodiment the address lines are also used as chip select signal lines, one address line for each integrated circuit. A Chip_select_clock_enable line is used to toggle the chip select signal to the desired device. In yet another embodiment, a select signal is clocked by a controller from one of the integrated circuits to the next in a fashion similar to a shift register. Once the select signal is present in the desired integrated circuit, the controller then provides an enable signal to all the integrated circuits which enables only that desired integrated circuit. In a preferred embodiment, a unique value is stored in a register on each integrated circuit. A controller places the unique value of a desired integrated circuit onto a bus. A comparator in each integrated circuit determines which chip has been selected. The controller then provides a chip select signal to activate the desired integrated circuit.

DETAILED DESCRIPTION OF THE PREFERRED EMBODIMENT

Figure 1:
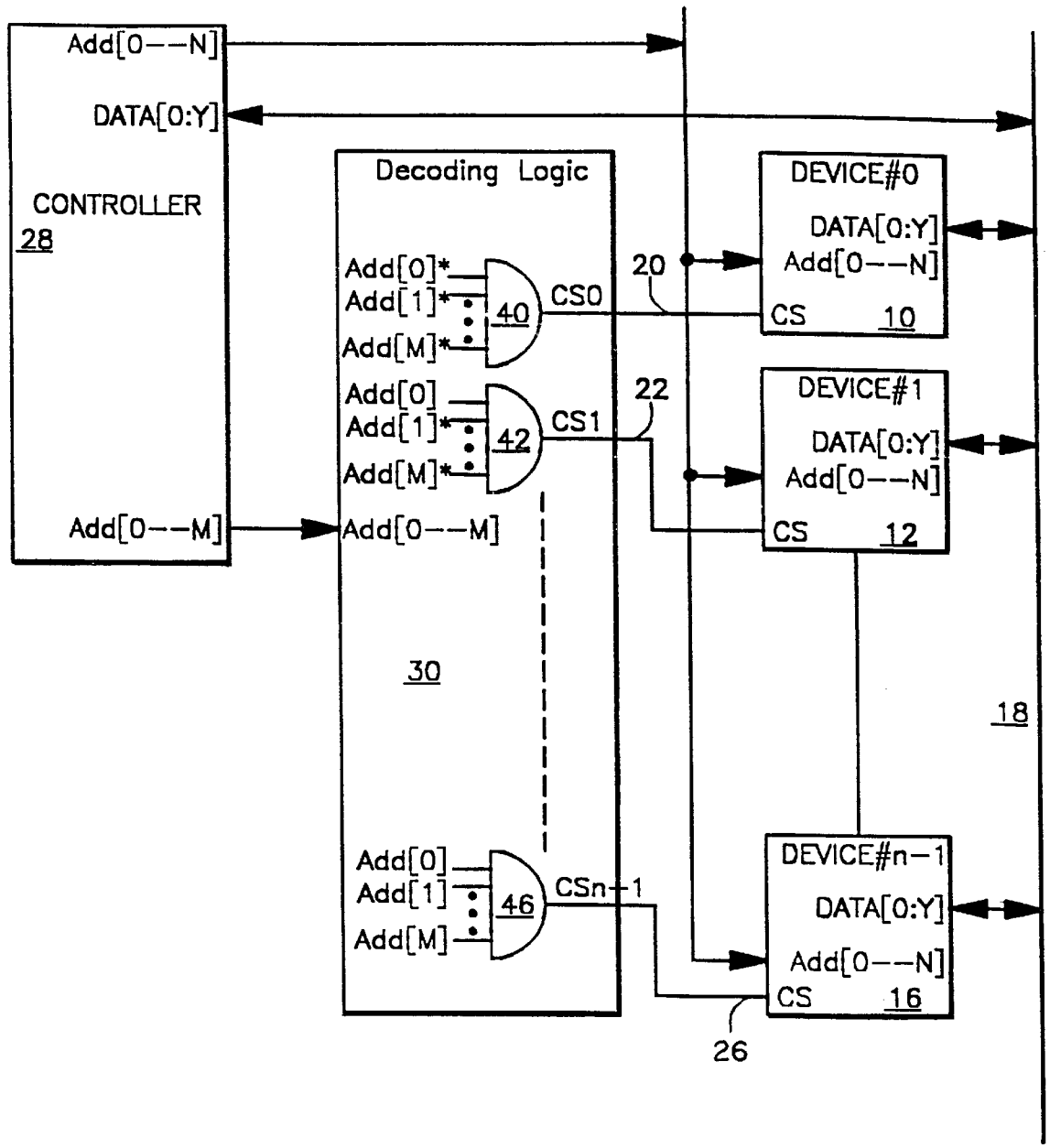
FIG. 1 shows a block diagram of a prior art chip select system.
Figure 2:
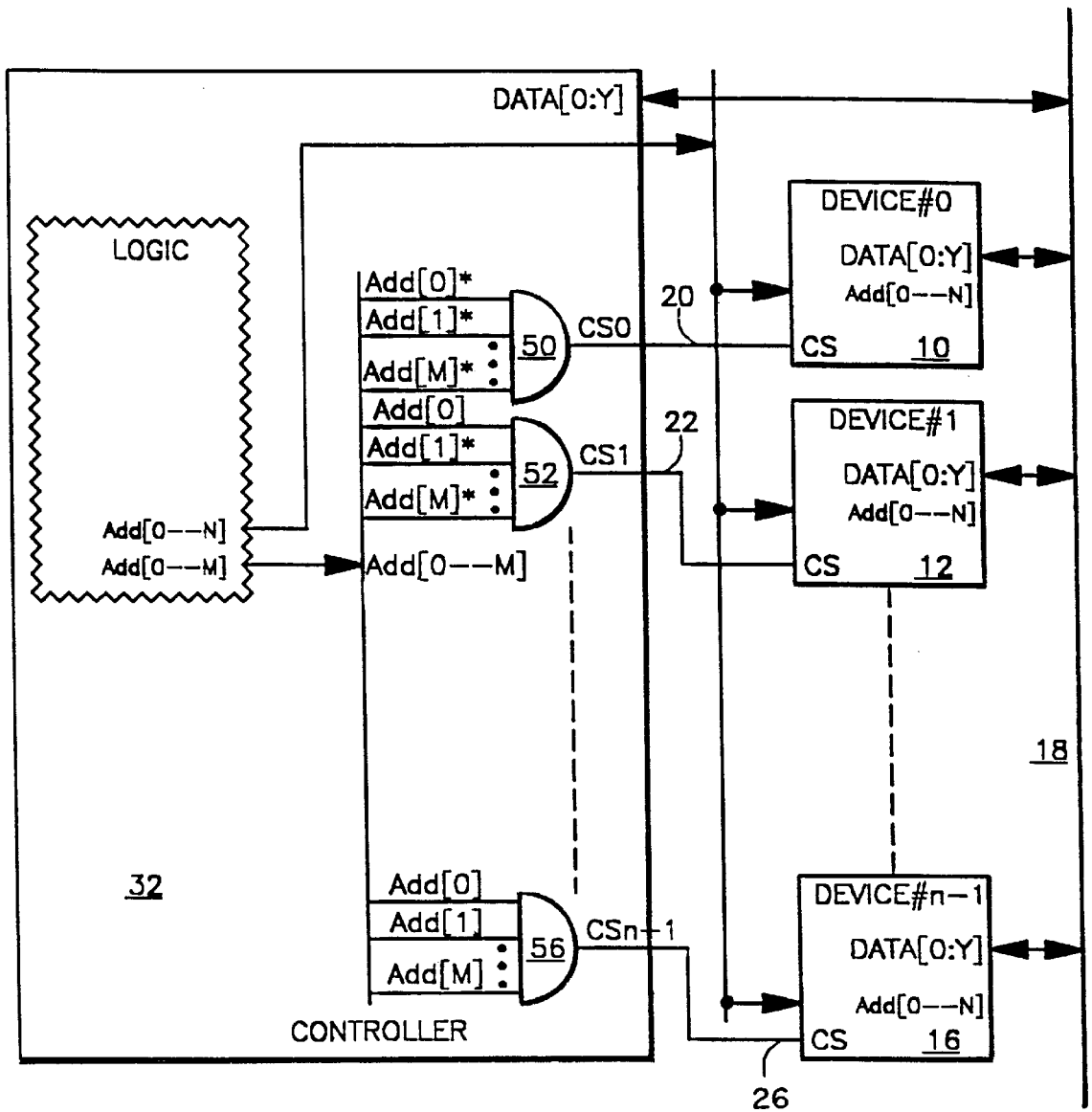
FIG. 2 shows a block diagram of an alternate prior art chip select system.
Figure 3:
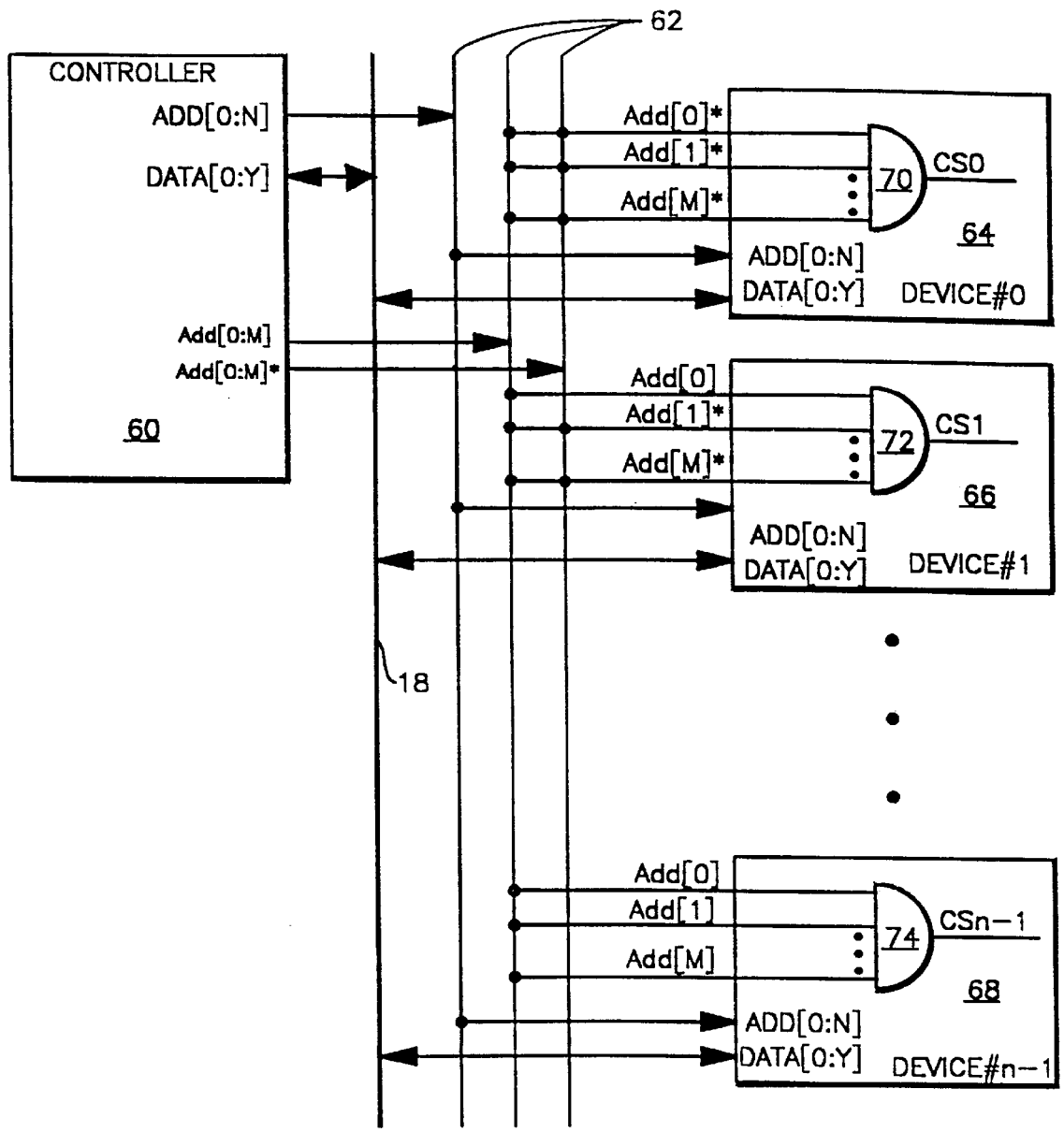
FIG. 3 shows a block diagram of a first embodiment of the present invention.

FIG. 3 shows a first embodiment of the present invention. A memory controller 60 includes logic circuits for generating a plurality of address output signals. According to this embodiment, the address signals and their respective complements are coupled onto a chip select/address bus 62. Only those address lines necessary for activating the appropriate one of a plurality memory devices 64, 66 through 68 are coupled to each respective memory device 64–68. Each memory device includes a chip select circuit that senses the chip select address and generates a chip select signal within an appropriate one of the memory devices 64–68. One design for the chip select circuit comprises an n-input AND gate 70, 72 through 74. By coupling each of the memory devices 64–68 to a unique set of the lines of the chip select address bus 62, each of the memory devices 64–68 are uniquely addressable.

As an example, assume that there are 32 memory devices 64–68. In a system built according to the prior art 32 chip select lines would be required to achieve the goal of activating only one of the 32 memory devices 64–68. However, building a system according to the embodiment of the present invention requires only ten lines in the chip select address bus 62. Less than one-third the number of lines are required to select among 32 memory devices using this embodiment of the present invention than with the prior art. This embodiment of the present invention provides for ten signal lines in the chip select address bus 62. This allows a memory board designer to use identical memory devices 64–68 in all of the sockets on the board.

Figure 4:
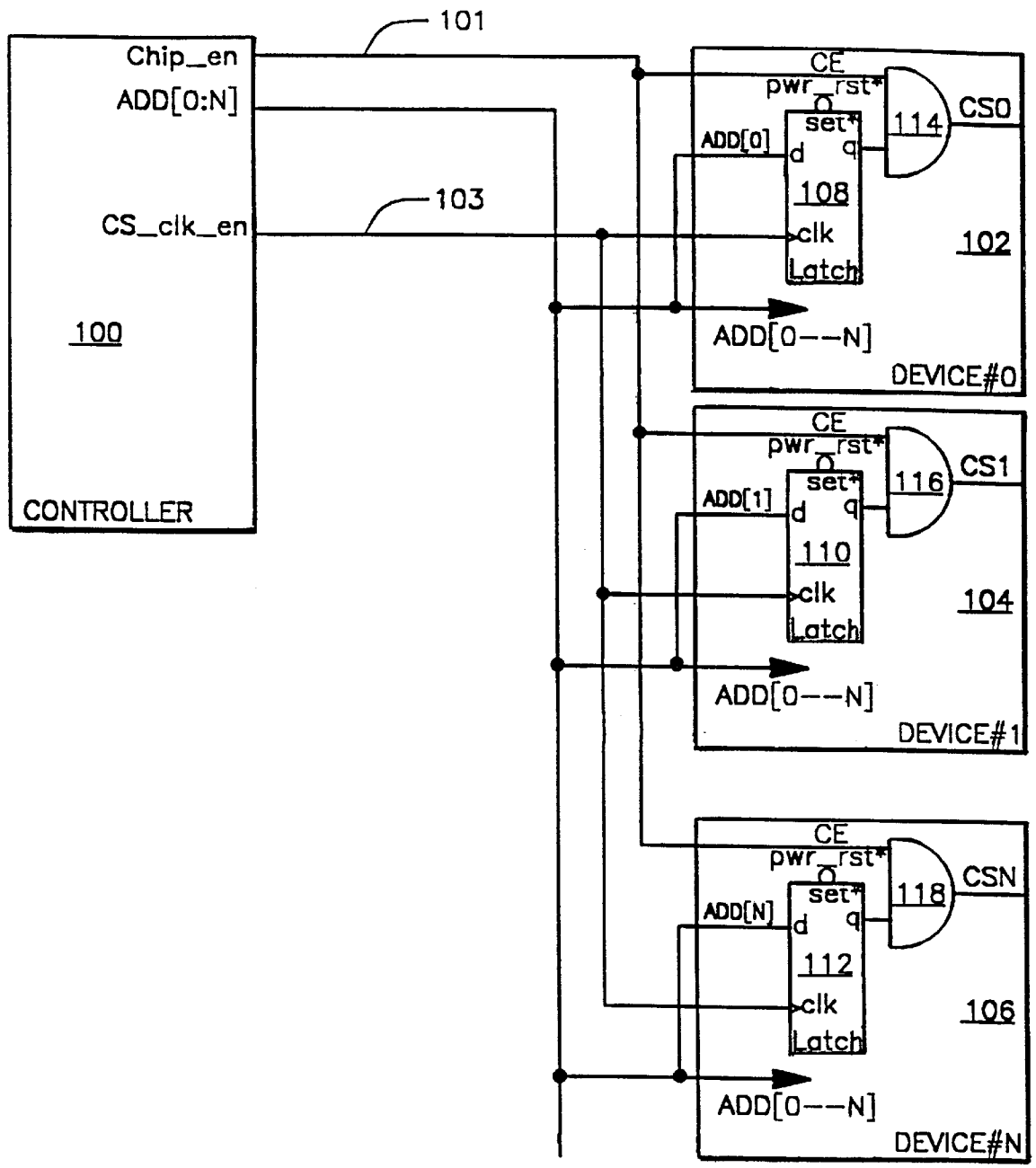
FIG. 4 shows a block diagram of a second embodiment of the present invention.

FIG. 4 shows a second embodiment of the present invention. A controller 100 is coupled for controlling among other things the selection of a particular one of a plurality of memory devices 102, 104 through 106. An address bus or data bus is controlled by the controller 100. Here the controller 100 multiplexes the chip select and address functions over the single bus. Once the appropriate chip select signal 101 is provided over the correct address line, the controller provides a chip_select_clock signal 103 which stores the information in the appropriate latch 108–112. The output of each latch is coupled to a two input AND gate 114, 116 through 118. Once the chip select signal 101 is held by its appropriate latch, the controller 100 then provides a clock signal in parallel to all the AND gates 114–118. By multiplexing the chip select and address function, all the chip select lines are effectively eliminated. This circuit limits the number of devices which can be selected amongst to the number of address lines. However, this embodiment provides the distinct advantage of allowing backward compatibility, i.e., if the pinout of an integrated circuit built according to this embodiment is the same as a prior art circuit and used in a system manufactured according to the present standard, the system will operate properly.

Figure 5:
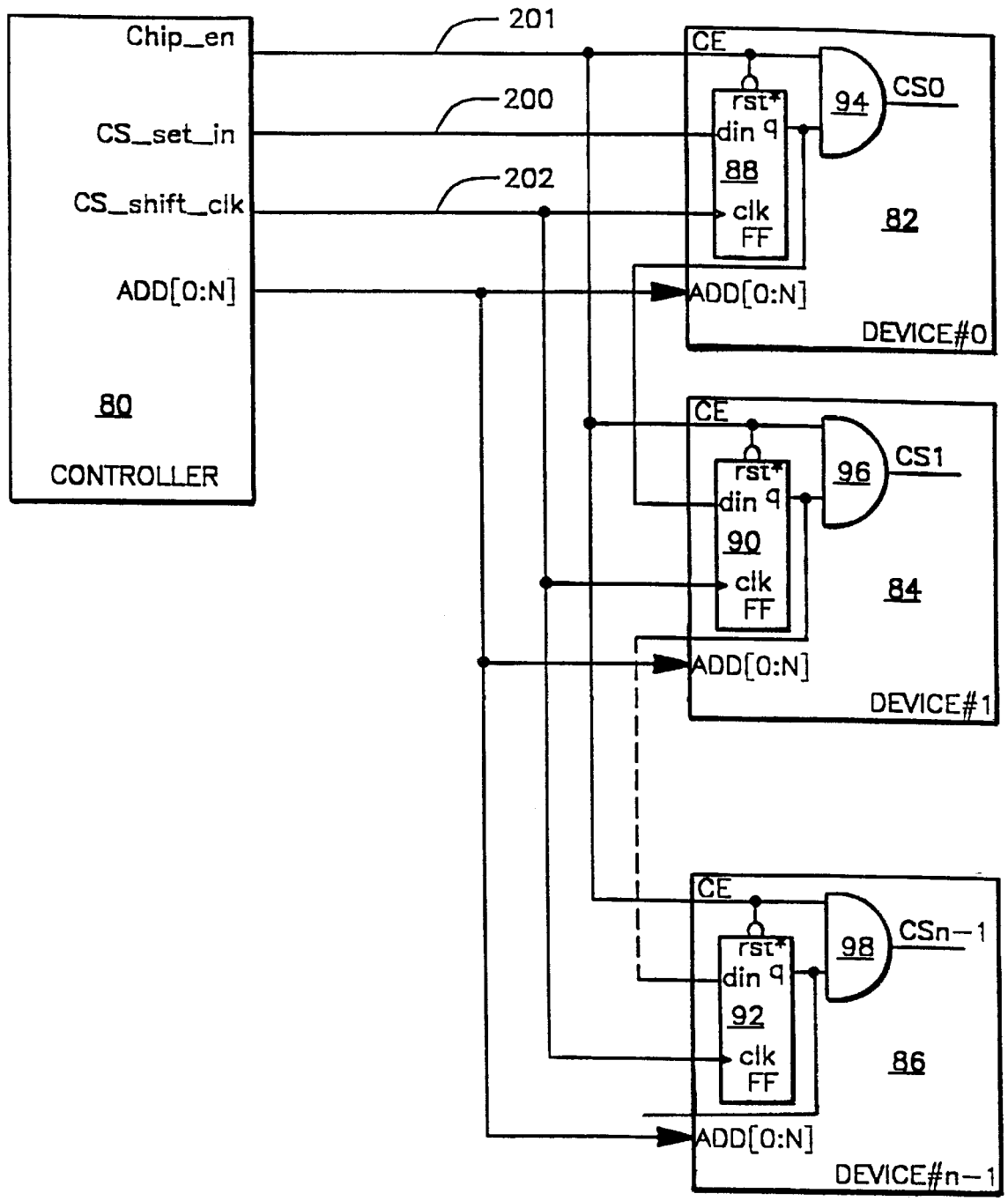
FIG. 5 shows a block diagram of a third embodiment of the present invention.

FIG. 5 shows a third embodiment of the present invention. In this embodiment, the controller 80 includes circuits for selecting only one of a plurality of memory devices 82, 84 through 86. Each of the memory devices according to the present invention is configured to include a D-type flip flop 88, 90 through 92. The chip_enable signal 201 is asserted activating all the chips 82, 84 through 86. The D input 200 of the flip flop 88 of the first memory device is coupled to receive a D signal 200 from the controller 80. The input of each successive flip flop 90–92 is coupled to receive its input from the output q of the preceding latch. The controller 80 generates a $D_{in}$ output that is coupled to a first memory device 82. Depending upon which memory device 82–86 is to be selected, the controller provides a predetermined number of chip_select_shift_clock signals 202 generated by the controller 80 to transfer the D signal through the latches 88–92 in a fashion similar to a shift register. The chip_select_shift_clock signal 202 output of the controller 80 is coupled in parallel to all the flip flops 88–92. Once the D signal is loaded into the appropriate flip flop 88–92, the controller 80 then provides a chip select enable signal in parallel to all the memory devices 82–86. The chip select enable signal is coupled in parallel to a two input AND gate 94, 96 and 98 in each of the memory devices and to an inverted reset for all the flip flop 88–92. The output of each flip flop 88–92 is coupled to its respective AND gate 94–98. The output of the appropriate AND gate 94–98 in the memory device 82–86 to which the D signal has been transferred will generate a chip select signal for the circuit upon assertion of the chip select enable signal by the controller 80.

If the D signal were left in its present position after a memory access, it may be possible to have two chips selected on a subsequent access. To avoid having two chips simultaneously accessed, the chip select enable also resets each flip flop 88–92 after each access as the chip select enable signal is deasserted. This embodiment has the distinct advantage of requiring only three signal lines for selecting the desired memory device. The only modest drawback is that the memory access performance of the system will slow by the number of chip_select_clock signals necessary to enable the desired memory device 82–86. This embodiment will be preferred for those systems where minimizing circuit board area is critical.

Figure 6:
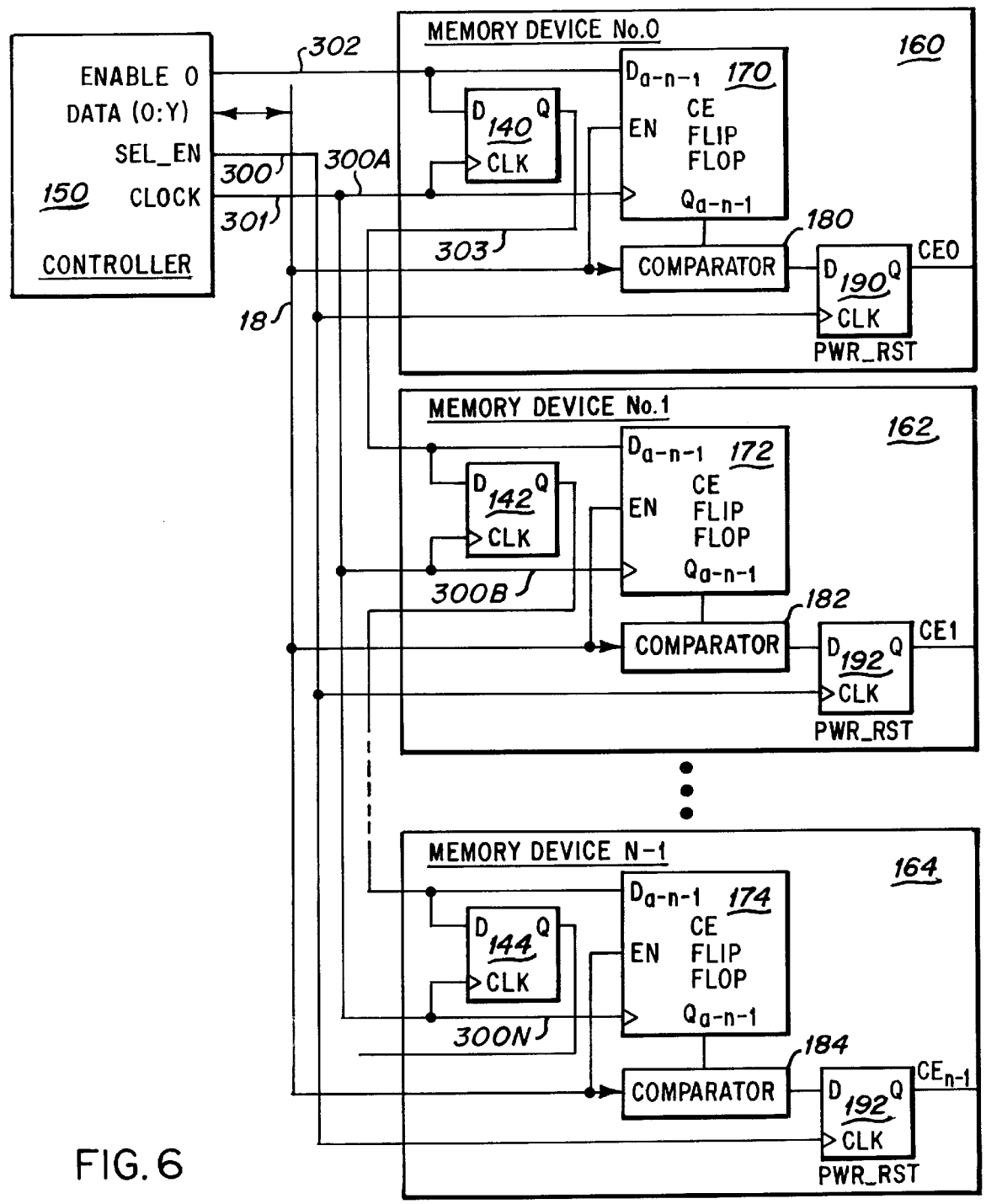
FIG. 6 shows a block diagram of a fourth and preferred embodiment of the present invention.

FIG. 6 shows a block diagram of the preferred embodiment of the present invention. A controller circuit 150 is coupled for controlling among other things the selection of a particular one of a plurality of memory devices 160, 162 through 164. Each of the memory devices 160–164 includes an n-bit register 170, 172 through 174, and an n-bit comparator 180, 182, 184, respectively. The controller 150 includes a data bus output that is coupled in parallel to all the inputs of the registers 170–176 and the comparators 180–184. Each of the registers also includes a clock input for receiving a clock signal 301 and an enable input for receiving an enable signal. The first enable signal en0 302 is generated by the controller 150, the remaining enable signals are generated by the preceding device. The controller 150 is configure to generate the clock signal 301 for the clock inputs.

Each of the memory devices also includes a D-type flip flop 140, 142 through 146, each having a clock input 300A through 300N, coupled in parallel to the clock input of its respective register 170–174 and a D input coupled in parallel with the enable input of its respective register 170–174. For the first memory device 160, the enable signal of the register 170 and the D input of the flip flop 140 are coupled under control of the controller 150. For the remaining memory devices the enable input of the register and the D input of the flip flop are the output of the flip flop from the preceding memory device. The output of each comparator 180–184 is coupled to the input of a D-type flip flop 190, 192 through 194, respectively. The clock input of the flip flops 190–194 are coupled in parallel to a chip select signal output of the controller 150. The output of the flip flops 190–194 are the chip select signals of their respective memory devices 160–164.

Upon a power up or reset signal, the controller 150 places a predetermined first value onto the data bus. The controller 150 then provides an enable signal 302 and a clock signal 301 to load the first value into the register 170 of the first memory device 160. The clock signal 301 is then de-asserted and a predetermined second value is placed by the controller 150 onto the data bus. When the controller 150 reasserts the clock signal 301, the flip flop 140 of the first memory device provides an enable signal 303 to the register 172 in the second memory device 162 and transfers the enable signal to the flip flop 142 in the second memory device. In this way each of the registers 170–174 are loaded with a unique predetermined value.

Once these values are stored, the controller 150 can then appropriately control the memory devices 160–164 for memory operations. To select a particular device, the controller first places the appropriate predetermined value onto the data bus. In each of the memory devices 160–164, that value is compared to the value stored in the respective registers 170–174 in the comparators 180–184. For the desired memory device, the output of the comparator will be a logical "1". Then the controller 150 provides a chip select signal 300 to all the flip flops 190–194. Only the flip flop 190–194 in the desired memory device 160–164 when the output of the appropriate comparator 180–184 is high will be able to provide a chip select signal to its respective memory device 160–164.

Using this preferred embodiment, if there are m signal lines in the data bus, the system can accommodate $2^m$ memory devices. This provides a significant improvement over the prior art. Further, there is no performance degradation. The controller 150 need merely place the appropriate predetermined value onto the data bus before the clock signal 301 and chip select signal 300 are required.

This invention has been described relative to specific embodiments. Modifications that become apparent to persons of ordinary skill in the art only after reading this document are deemed within the spirit and scope of this invention.

What is claimed is:

1. A selection circuit for use in a computer system having a plurality of memory chips bi-directionally coupled to a common data bus, the selection circuit for enabling communication among the memory chips and between the memory chips and devices within the computer system by selecting one of the plurality of memory chips to be connected to the data bus and comprising:

a. a plurality of memory selection circuits starting with a first memory selection circuit, one in each of the plurality of memory chips, the memory selection circuits serially coupled to one another, each memory selection circuit including, a storage device having an input terminal, a clock input terminal, a reset input terminal for receiving a reset signal to reset the storage device and an output terminal coupled to the storage device input terminal of the next succeeding memory selection circuit for interconnection between memory chips.

a logic circuit having a first input terminal and a second input terminal coupled to the storage device output terminal and operative to generate a chip select signal for enabling the selected memory chip to communicate through the data bus; and b. a controller circuit, coupled to the data bus, having a chip enable output terminal coupled to the reset input terminal of each one of the storage devices and the logic circuit first input terminal, the controller circuit further having a memory enable output terminal, coupled to the storage device input terminal of the first memory selection circuit, for providing a memory select signal and a chip select clock output terminal for coupling a clock signal to the clock input terminal of each of the memory select circuits, the clock signal having a plurality of clock pulses starting with a first clock pulse and the number of clock pulse being representative of the sequential order of the memory chip being selected, whereupon activation of the memory select signal, the clock signal clocks the memory select signal at the occurrence of the first clock pulse into the storage device of the first memory select circuit and into succeeding storage devices upon the occurrence of each of the sequential clock pulses until a chip enable signal is activated at the chip enable output terminal to generate the chip select signal for the memory chip being selected and whereupon deactivation of the chip select signal, the plurality of storage devices are reset to deselect the selected memory chip.

2. A selection circuit as recited in claim 1 wherein the logic circuit is an AND gate.

3. A selection circuit as recited in claim 1 wherein the storage location is a D-type flip flop.

4. A selection circuit as recited in claim 1 wherein each of the plurality of memory chips is a flash chip.

5. A selection circuit for use in a computer system having a plurality of memory chips bi-directionally coupled to a common data bus, the selection circuit for enabling communication among the memory chips and between the memory chips and devices within the computer system by selecting one of the plurality of memory chips to be connected to the data bus and comprising:

a. a plurality of memory selection circuits starting with a first memory selection circuit, one in each of the plurality of memory chips, each memory selection circuit including, a latching device having an input terminal, a clock input terminal and an output terminal, the latching device for sampling and holding an input signal applied to the latching device input terminal, a logic circuit having a first input terminal and a second input terminal and operative to generate a chip select signal for enabling the selected memory chip to communicate through the data bus; and b. a controller circuit, coupled to the data bus, having a chip enable output terminal, coupled to the first input terminal of the logic circuit, a plurality of address output terminals, each terminal for providing an address signal to the latching device input terminal of each of the memory selection circuits, the controller circuit further having a chip select clock output terminal for coupling a clock signal to the clock input terminal of each of the memory select circuits, the clock signal for enabling the latching device to sample and hold the input signal, wherein the controller circuit provides the input signal to the latching device of each of the memory select circuits through the plurality of address output terminals and further provides the clock signal and a chip enable signal through the chip enable output terminal for generating the chip select signal in the memory chip being selected.

6. A selection circuit as recited in claim 5 wherein the latching circuit of every memory chip includes a reset input terminal responsive to a reset signal for resetting the latch circuit to deselect any selected memory chips.

7. A selection circuit as recited in claim 5 wherein each of the plurality of memory chips is flash memory.

8. A selection circuit for use in a computer system having a plurality of memory chips, starting with a first memory chip, the memory chips bi-directionally coupled to a common data bus, the selection circuit for using only one bus to programmably assign a unique address to each of the memory chips and to enable communication among the memory chips and between the memory chips and devices within the computer system by connecting one of the plurality of the memory chips to the data bus comprising:

a. A controller circuit coupled to the data bus for generating an enable signal, a select signal and a clock signal;

b. A first memory selection circuit, residing in one the plurality first memory chip, said first memory selection circuit including, a first storage device responsive to said enable signal and said clock signal and operative to generate a serial chip enable signal for serially coupling the first storage device to the next succeeding memory selection circuit, a first register device responsive to the data bus, said enable signal and said clock signal and operative to generate the unique address of said first memory chip, a first comparater circuit responsive to said first memory chip unique address and the data bus, said comparater circuit operative to develop a first chip select signal for being active if said first memory chip unique address matches a value presented on the data bus and for being inactive if said first memory chip unique address does not match the value presented on the data bus, c. A plurality of memory selection circuits starting with a first memory selection circuit, one in each of the plurality of memory chips, the memory selection circuits serially coupled to one another, each memory selection circuit including, a storage device responsive to said clock signal and operative to develop a serial output for coupling the storage device to the storage device of the next succeeding memory selection circuit, a register device responsive to the data bus and to said serial output signal of the storage device of the previous memory selection device and to said clock signal, said register device operative to generate the unique address of the memory chip in which said register device resides, a comparater circuit responsive to the memory chip unique address and the data bus, said comparater circuit operative to develop a chip select signal for being active if said memory chip unique address matches a value presented on the data bus and for being inactive if said memory chip unique address does not match the value presented on the data bus, whereupon activation of said enable signal, said clock signal clocks the unique address of the first memory chip being presented on the data bus into the first register device for storage therein and said first storage device, through the use of said clock signal, sequentially enables each of the plurality of storage devices and each of the plurality of register device to successively store the unique address associated with each of the respective memory chips in the register device, whereupon deactivation of the enable signal and activation of the select enable, the unique address of one of the plurality of memory chips is presented on the data bus to select one of the memory chips.

9. A selection circuit as recited in claim 8 wherein each of the plurality of memory chips is flash memory.

10. A selection circuit as recited in claim 8 wherein said first memory selection circuit further includes a D-type flip flop having an input terminal for receiving said first chip select signal and a reset terminal for receiving said select signal, said flip flop operative to develop a first memory select signal for selecting the first memory chip upon activation of said select signal.

11. A selection circuit as recited in claim 8 wherein each of said memory selection circuits further includes a D-type flip flop having an input terminal for receiving said chip select signal, a reset terminal for receiving said select signal and operative to develop a memory select signal for selection of the memory chip in which said flip flop resides upon activation of said select signal.

12. In a computer system having a plurality of memory chips serially coupled to one another starting with a first memory chip and being bi-directionally coupled to a common data bus, a method for using only one bus to programmably assign a unique address to each of the memory chips and to enable communication among the memory chips and between the memory chips and devices within the computer system by connecting one of the plurality of the memory chips to the data bus comprising:

a. Providing a controller circuit coupled to the data bus for generating an enable signal, a select signal and a clock signal;

b. Providing a plurality of memory selection circuits, each in one of the plurality of memory chips starting with a first memory selection circuit in the first memory chip, each of the memory selection circuits including a storage device for receiving an output signal generated by the previously-successive storage device starting from a first output signal and for receiving the clock signal and for further generating the output signal, the first storage device for receiving the enable signal, the clock signal and for generating the first output signal, each of the memory selection circuits further including a register device including a first register device within the first memory selection device for receiving the data bus, the enable signal and the clock signal and for generating a unique address associated with each of the plurality of memory chips, each of the memory selection circuits further including a comparator for receiving the unique address and the data bus;

c. Providing the clock signal for clocking the enable signal into the first storage device and for clocking the output signal from the previous storage device into each of the plurality of storage devices except the first storage device;

d. Upon initialization of the computer system, presenting a unique address value associated with one of the plurality of memory chips on the data bus for assigning each of the memory chips with their respective unique addresses;

e. Storing the presented unique address value in the register;

f. During regular operation of the computer system, comparing the stored address value to a value presented on the data bus for determining whether they are equal;

g. generating a memory select signal,
wherein upon the stored address value being equal to the value presented on the data bus, the memory select signal is activated for selection of the respective memory chip.

* * * * *